United States Patent

Li

Patent Number: 6,008,114
Date of Patent: Dec. 28, 1999

[54] METHOD OF FORMING DUAL DAMASCENE STRUCTURE

[75] Inventor: Tzung-Han Li, Taipei, Taiwan

[73] Assignee: United Microelectronics Corp., Hsinchu, Taiwan

[21] Appl. No.: 09/137,762

[22] Filed: Aug. 20, 1998

[30] Foreign Application Priority Data

Jun. 8, 1998 [TW] Taiwan ............... 87109050

[51] Int. Cl.$^6$ ............... H01L 21/4763
[52] U.S. Cl. ............... 438/618; 438/620; 438/624; 438/634; 438/637; 438/638; 438/640; 438/644; 438/654; 438/666; 438/672
[58] Field of Search ............... 438/618, 620, 438/624, 626, 631, 634, 637, 638, 640, 644, 654, 666, 667, 668, 672, 687

[56] References Cited

U.S. PATENT DOCUMENTS

| | | | |
|---|---|---|---|
| 5,753,967 | 5/1998 | Lin | 257/635 |
| 5,900,672 | 5/1999 | Chan et al. | 257/751 |
| 5,916,011 | 6/1999 | Kim et al. | 451/41 |
| 5,918,150 | 6/1999 | Nguyen et al. | 438/687 |
| 5,935,762 | 8/1999 | Dai et al. | 430/312 |
| 5,939,334 | 8/1999 | Nguyen et al. | 438/689 |
| 5,939,788 | 8/1999 | McTeer | 257/751 |

*Primary Examiner*—Jey Tsai
*Assistant Examiner*—Lynne A. Gurley
*Attorney, Agent, or Firm*—Hickman Stephens & Coleman, LLP

[57] ABSTRACT

A method of forming a dual damascene structure includes providing a substrate having a metallic layer already formed thereon, and then forming a dielectric layer having a top-wide/bottom-narrow opening over the substrate to expose a portion of the metallic layer. Next, the metallic layer is over-etched by applying etchant through the opening to form a groove in the metallic layer so that additional metallic layer surface is exposed. Thereafter, a glue layer is formed over the opening and the groove surface. If the glue layer is a metal, a high-temperature operation is carried out to form a low resistance alloy at the junction between the metallic layer and the glue layer. Consequently, ohmic contact area and reliability of the device are increased. Finally, conventional processes are used to deposit metal into the opening followed by the planarization of the newly deposited metallic layer.

13 Claims, 4 Drawing Sheets

0,008,114

METHOD OF FORMING DUAL DAMASCENE STRUCTURE

CROSS-REFERENCE TO RELATED APPLICATION

This application claims the priority benefit of Taiwan application Ser. No. 87109050, filed Jun. 8, 1998, the full disclosure of which is incorporated herein by reference.

BACKGROUND OF THE INVENTION

1. Field of Invention

The present invention relates to a method of forming dual damascene structure. More particularly, the present invention relates to a method of forming dual damascene structure that has a greater ohmic contact area.

2. Description of Related Art

FIGS. 1A through 1D are cross-sectional views showing the progression of manufacturing steps in forming a dual damascene structure according to a conventional method. First, a patterned conductive layer 102 is formed in a substrate 100 having certain device structures (not drawn) formed thereon as shown in FIG. 1A. Next, an oxide layer 104 and a silicon nitride layer 106 are sequentially formed over the substrate 100.

Thereafter, as shown in FIG. 1B, photolithographic and etching techniques are used to pattern the silicon nitride layer 106 to form an opening. Subsequently, an insulating layer 108 is formed over the substrate 100. Then, using a patterned photoresist layer (not drawn) as a mask, the insulating layer 108 is anisotropically etched in a dry etching operation to form an insulating layer 108a. In the meantime, using the silicon nitride layer 106a as a mask, the oxide layer 104 is also etched until the conductive layer 102 is exposed.

Consequently, a trench 110a is formed in the oxide layer 104a and the insulating layer 108a as shown in FIG. 1C. Thereafter, a glue layer 112 is formed over the insulating layer 108a and the oxide layer 104a on the interior surface of trench 110a. Later, the trench 110a is completely filled by a metal to form a metallic layer 114. Finally, a chemical-mechanical polishing (CMP) method is used to remove portions of the metallic layer 114 lying above the insulating layer 108a, thereby forming a metal plug 114a and a conductive line 114b as shown in FIG. 1D.

For a conventional dual damascene structure, its conductive layer 102 and its metal plug 114a have a two-dimensional contact area. As the line width of semiconductor devices continues to shrink, contact area provided by the aforementioned method will shrink as well. Hence, resistance of the ohmic contact will continue to increase, thus affecting reliability of the integrated circuit devices.

In light of the foregoing, there is a need to improve the method of forming dual damascene structure.

SUMMARY OF THE INVENTION

Accordingly, the present invention provides a method of forming a dual damascene structure capable of increasing the contact area between metallic layers, hence lowering the resistance of ohmic contact and increasing device reliability.

To achieve these and other advantages and in accordance with the purpose of the invention, as embodied and broadly described herein, the invention provides a method of forming dual damascene structure. The method includes providing a substrate having a metallic layer already formed thereon, and then forming a dielectric layer having a top-wide/bottom-narrow opening over the substrate to expose a portion of the metallic layer. Next, the metallic layer is over-etched by etchant passing through the opening to form a groove in the metallic layer so that additional metallic layer surface is exposed. Thereafter, a glue layer is formed over the opening and the groove surface. If the glue layer is a metal, a high-temperature operation is carried out to form a low resistance alloy layer at the junction between the metallic layer and the glue layer. Consequently, ohmic contact area and reliability of the device are increased. Finally, conventional processes are used to deposit metal into the opening followed by the planarization of the newly deposited metallic layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
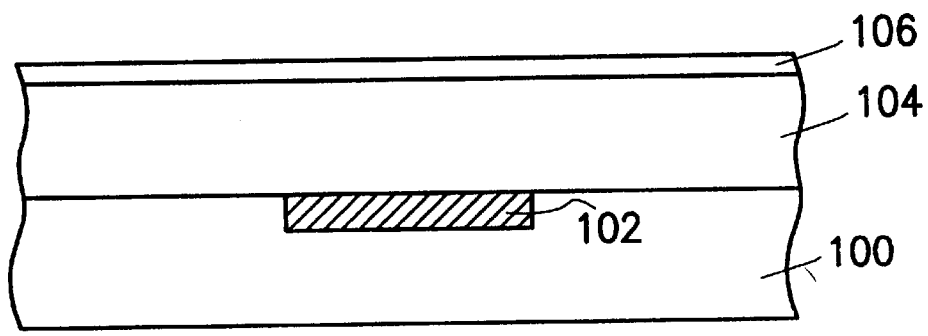
FIGS. 1A through 1D are cross-sectional views showing the progression of manufacturing steps in forming a dual damascene structure according to a conventional method.
Figure 1B:
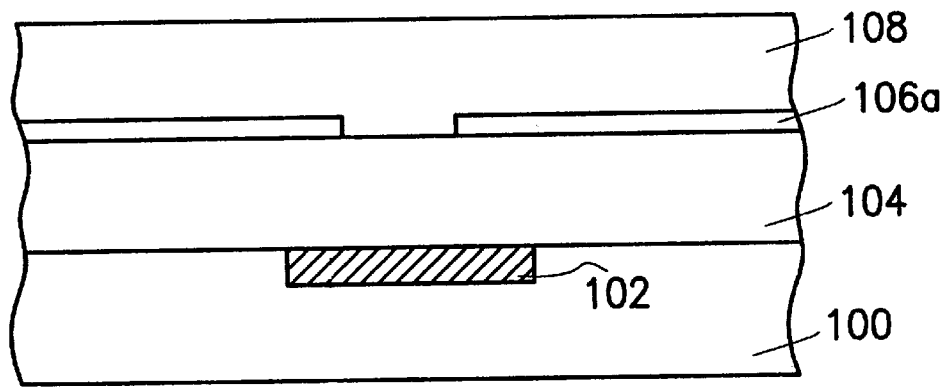
Figure 1C:
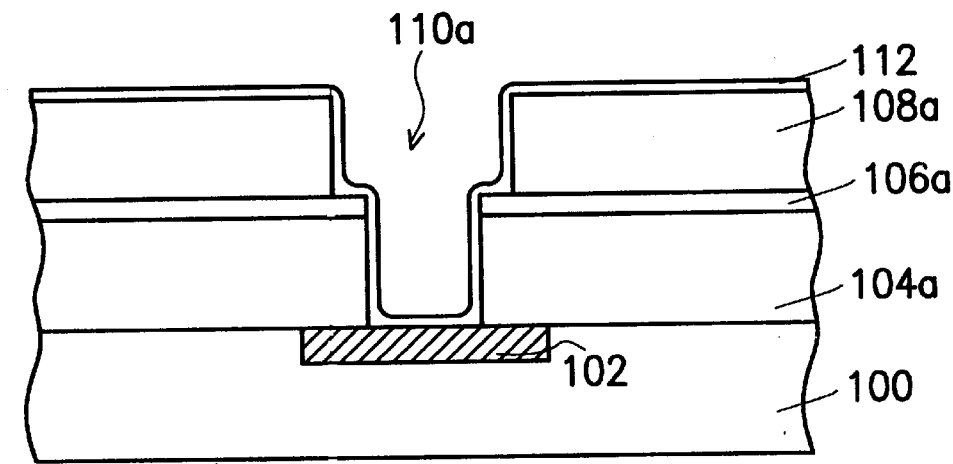
Figure 1D:
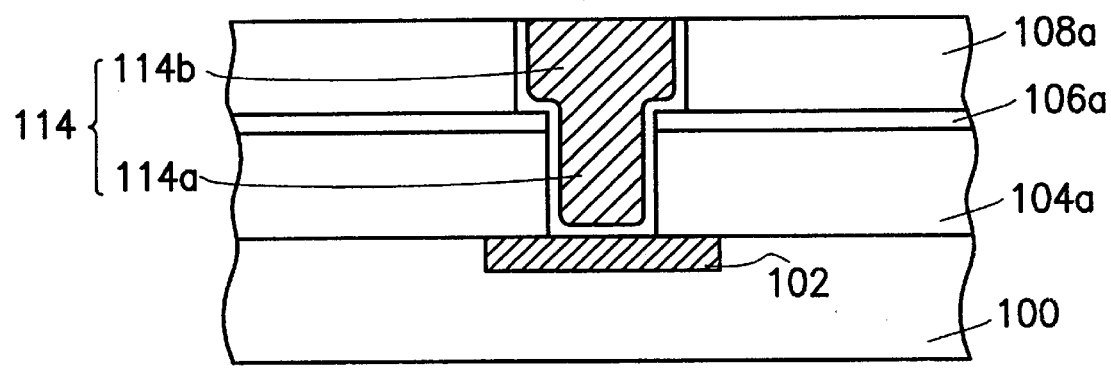

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of manufacturing steps in forming a dual damascene structure according to one preferred embodiment of this invention.

Figure 2A:
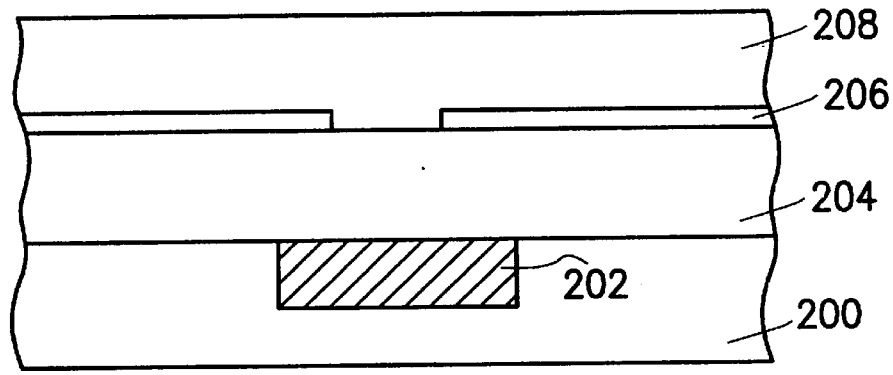
FIGS. 2A through 2E are cross-sectional views showing the progression of manufacturing steps in forming a dual damascene structure according to one preferred embodiment of this invention.

First, a patterned conductive layer 202 is formed in a substrate 200 having certain device structures (not shown) already formed thereon as shown in FIG. 2A. The conductive layer 202 can be made from a metal such as copper, and the conductive layer 202 can be patterned into a conductive line or a damascene structure, for example. Thereafter, a dielectric layer 204 is formed over the substrate 200, and then a layer of hard material 206, for example, a silicon nitride layer, having an opening is formed over the dielectric layer 204. The opening is formed directly above the conductive layer 202. Then, another dielectric layer 208 is formed over the layer of hard material 206. The dielectric layers 204 and 208 can both be oxide layers, for example.

Next, using the layer of hard material 206 as a mask, the dielectric layer 208 is patterned using photolithographic and etching processes. When etching of the dielectric layer 208 has finished, etching of the dielectric layer 204 continues down through the opening in the layer of hard material 206 to form an opening 210 that exposes the conductive layer 202. The opening 210 has a top-wide/bottom-narrow profile.

Figure 2B:
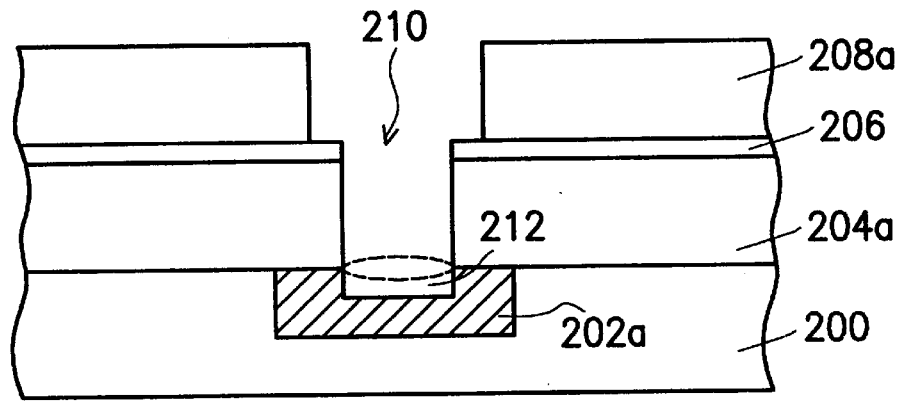

Subsequently, following the profile at the lower section of the opening 210, the exposed conductive layer 202 is over-etched to form a conductive layer 202a. The etchant does not etch right through the conductive layer 202a, it only forms a groove 212 in the conductive layer 202a as shown in FIG. 2B. The groove 212 serves to increase the contact area between subsequently formed glue layer and conductive material above.

Figure 2C:
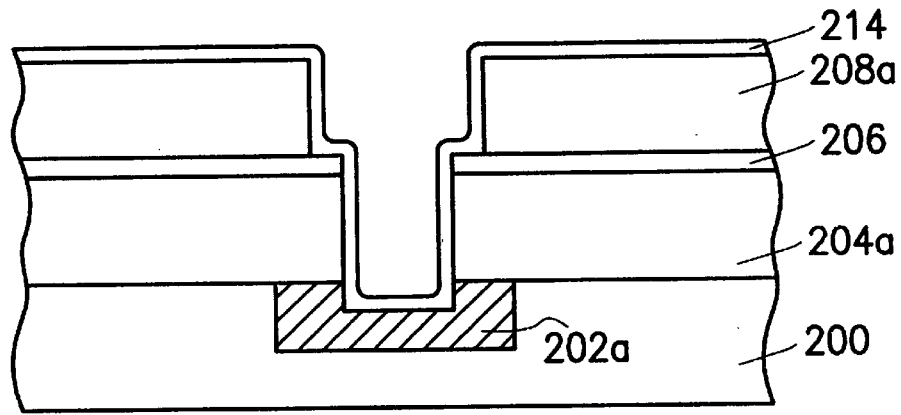

Next, as shown in FIG. 2C, a glue layer 214 is formed over the interior surface of the opening and the groove 212. The glue layer 214 covers at least the exposed conductive layer 202a and the dielectric layers 204a and 208a. The glue layer 214 can be a titanium layer, for example. Since the groove 212 has side surfaces as well as a bottom surface, the glue layer 214 and the conductive layer 202a forms a three-dimensional contact area. Hence, this invention is capable of providing a larger contact area than a conventional manufacturing process, and is able to prevent contact problems when line width is reduced due to miniaturization.

Figure 2D:
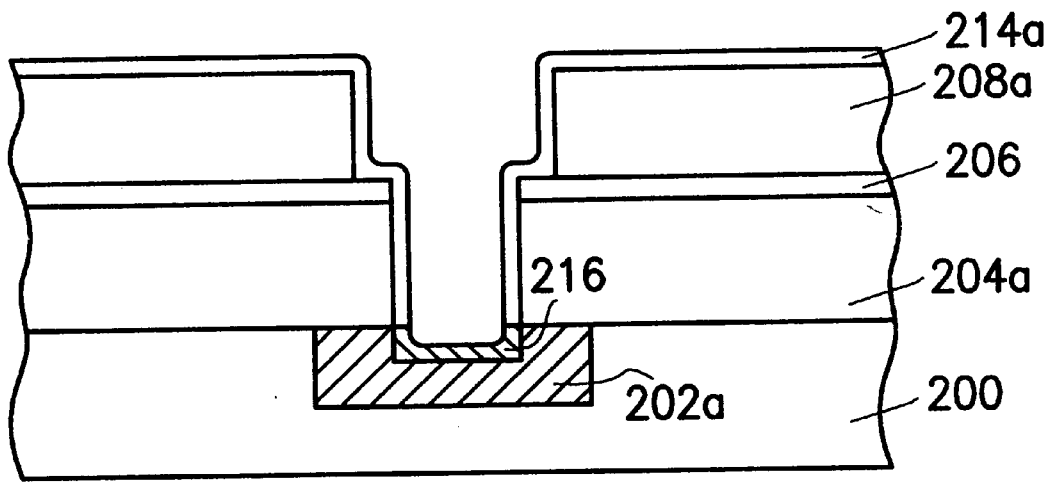

If the conductive layer 202a is a metal, a high-temperature operation is carried out to form a low resistance alloy 216 at the junction between the metallic layer 202a and the glue layer 214 as shown in FIG. 2D. Through the high-temperature operation, ohmic contact between the glue layer 214 and the metallic layer 202a is be consolidated. The high-temperature operation can include a rapid thermal process (RTP), or an annealing operation. Finally, processes similar to the conventional method are carried out.

Figure 2E:
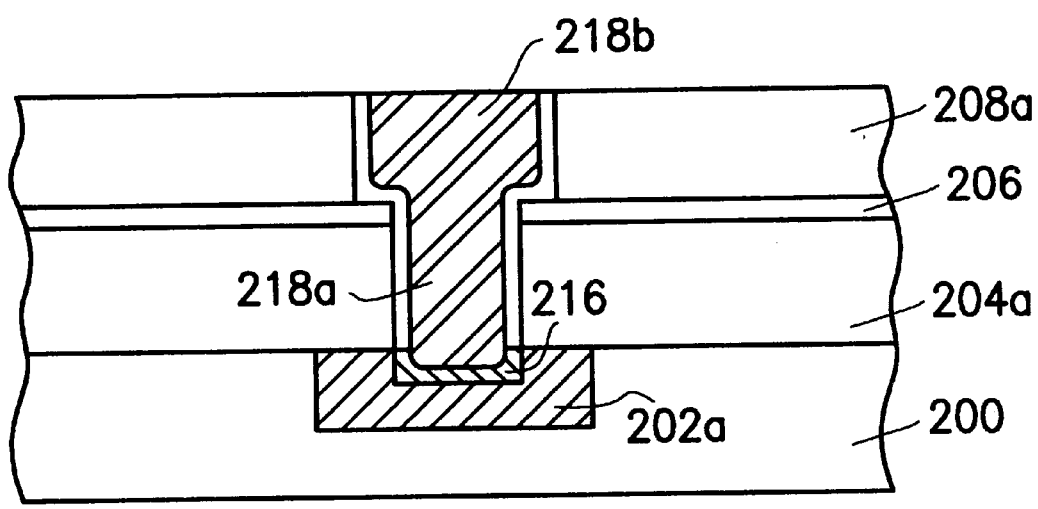

First, conductive material is deposited into the opening 210 and over the dielectric layer 208a to form a conductive layer 218. Then, a chemical-mechanical polishing method is used to remove the portion of the conductive layer 218 above the dielectric layer 208a. The conductive layer 218 completely fills the opening 210 and the groove 212, and has a height at least the same as that of the dielectric layer 208a. The conductive layer 218 can be made from copper. The final structure comprising a metal plug 218a and a conductive line 218b is shown in FIG. 2E.

In summary, this invention utilizes an etching operation to over-etch the metallic layer above the substrate into a groove so that the metallic layer has a larger exposed area. Therefore, a larger contact area can be provided for subsequent formation of a glue layer, and hence poor contact between metallic layers is avoided. In addition, a rapid thermal process or an annealing operation can be conducted to form an alloy layer between the glue layer and the metallic layer, thereby forming an ohmic contact having a lower contact resistance.

Since the top-wide/bottom-narrow opening is not a major aspect of this invention, those who are familiar with semiconductor technologies can apply other conventional methods or known means to fabricate the structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dual damascene structure, the method comprising:

providing a substrate;

forming a patterned first conductive layer in the substrate;

forming a dielectric layer over the substrate and the first conductive layer;

forming a top-wide/bottom-narrow opening in the dielectric layer that exposes a portion of the first conductive layer;

removing a portion of the exposed first conductive layer at the bottom of the opening to form a groove without forming a hole through the first conductive layer;

forming a glue layer over the exposed first conductive layer and the surface of the dielectric layer; and forming a second conductive layer filling the opening and the groove so that the top surface of the second conductive layer is at least at the same height as the top surface of the dielectric layer.

2. The method of claim 1, wherein the step of forming the first conductive layer includes depositing metallic material.

3. The method of claim 1, wherein the step of forming the second conductive layer includes depositing metallic material.

4. The method of claim 1, wherein the groove in the first conductive layer provides a larger than conventional surface area for contact with the second conductive layer.

5. The method of claim 1, wherein the step of forming a second conductive layer filling the opening and the groove further includes the substeps of:

forming a second conductive layer over the substrate that extends over the top surface of the dielectric layer; and using a chemical-mechanical polishing method to remove the second conductive layer above the dielectric layer so that the top surface of the second conductive layer is at least at the same height as the top surface of the dielectric layer.

6. A method of forming a dual damascene structure, the method comprising the steps of:

providing a substrate;

forming a patterned first metallic layer in the substrate;

forming a dielectric layer over the substrate and the first metallic layer;

forming a top-wide/bottom-narrow opening in the dielectric layer the exposes a portion of the first metallic layer;

removing a portion of the exposed first metallic layer at the bottom of the opening to form a groove without forming a hole through the first metallic layer;

forming a glue layer at least covering the exposed first metallic layer and the interior surface of the opening;

performing a high-temperature processing operation; and forming a second metallic layer filling the opening and the groove so that the top surface of the second metallic layer is at least at the same height level as the top surface of the dielectric layer.

7. The method of claim 6, wherein the groove in the first metallic layer provides a larger than conventional surface area for contact with the second metallic layer.

8. The method of claim 6, wherein the step of performing the high-temperature processing is to allow the glue layer and the first metallic layer to react, forming an improved ohmic contact between the second metallic layer and the first metallic layer.

9. The method of claim 6, wherein the step of forming the glue layer includes depositing metallic material.

10. The method of claim 6, wherein the step of performing the high-temperature processing operation includes a rapid thermal processing.

11. The method of claim 6, wherein the step of performing the high-temperature processing operation includes an annealing operation.

12. The method of claim 6, wherein the step of forming a second metallic layer filling the opening and the groove further includes the substeps of:

forming a second metallic layer over the substrate that extends over the top surface of the dielectric layer; and using a chemical-mechanical polishing method to remove the second metallic layer above the dielectric layer so that the top surface of the second metallic layer is at least at the same height as the top surface of the dielectric layer.

13. The method of claim 6, wherein the step of forming the second metallic layer includes depositing copper.

* * * * *